United States Patent
Suh

(10) Patent No.: US 12,340,859 B2
(45) Date of Patent: Jun. 24, 2025

(54) HYBRID MEMORY SYSTEM WITH INCREASED BANDWIDTH

(71) Applicant: QUALCOMM Incorporated, San Diego, CA (US)

(72) Inventor: Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/668,593

(22) Filed: May 20, 2024

(65) Prior Publication Data
US 2024/0304271 A1 Sep. 12, 2024

Related U.S. Application Data

(63) Continuation of application No. 17/658,846, filed on Apr. 12, 2022, now Pat. No. 12,073,901.
(60) Provisional application No. 63/284,439, filed on Nov. 30, 2021.

(51) Int. Cl.
| | |
|---|---|
| *G11C 29/42* | (2006.01) |
| *G11C 7/10* | (2006.01) |
| *G11C 8/18* | (2006.01) |
| *G11C 29/12* | (2006.01) |

(52) U.S. Cl.
CPC ............ *G11C 29/42* (2013.01); *G11C 7/1048* (2013.01); *G11C 7/1063* (2013.01); *G11C 8/18* (2013.01); *G11C 29/1201* (2013.01)

(58) Field of Classification Search
CPC ... G11C 29/42; G11C 29/1202; G11C 7/1048; G11C 7/1063; G11C 8/18; G11C 29/1201
See application file for complete search history.

(56) References Cited

U.S. PATENT DOCUMENTS

| | | | |
|---|---|---|---|
| 6,018,778 A  * | 1/2000 | Stolowitz | G06F 3/0626 710/52 |
| 7,073,035 B2 | 7/2006 | Ware et al. | |
| 8,089,813 B2 * | 1/2012 | Dreps | G11C 5/063 365/185.2 |
| 8,385,142 B1 | 2/2013 | Lin et al. | |
| 8,489,839 B1 | 7/2013 | Karandikar et al. | |

(Continued)

FOREIGN PATENT DOCUMENTS

KR 20230017711 A 2/2023

OTHER PUBLICATIONS

Intel: "External Memory Interfaces Intel® Agilex™ FPGA IP User Guide", IP Version 2.0.0, UG-20218, Feb. 10, 2020, pp. 1-209.

(Continued)

*Primary Examiner* — Justin R Knapp
(74) *Attorney, Agent, or Firm* — W&T/Qualcomm

(57) ABSTRACT

A hybrid memory system with improved bandwidth is disclosed. In one aspect, a memory system is provided that increases bandwidth relative to the JEDEC low-power double data rate version 5 (LPDDR5) standard. This improvement is made possible by increasing a data conductor count from sixteen to twenty-four. Optionally, the bandwidth may be further improved by increasing a clock frequency from a first value to a second value. This allows the hybrid memory system to provide improved bandwidth without the complications of merely doubling pin counts or doubling clock speed. Further, coding techniques tailored to the pin count and pin layout are provided.

14 Claims, 10 Drawing Sheets

(56) References Cited

U.S. PATENT DOCUMENTS

| | | | |
|---|---|---|---|
| 9,171,585 B2 | 10/2015 | Rajan et al. | |
| 9,588,840 B2* | 3/2017 | Chung | G06F 11/1048 |
| 9,922,695 B2 | 3/2018 | Tomishima et al. | |
| 10,186,309 B2 | 1/2019 | Oh et al. | |
| 10,331,517 B2 | 6/2019 | Suh | |
| 10,431,268 B2* | 10/2019 | Choi | G11C 29/028 |
| 10,467,177 B2* | 11/2019 | Shokrollahi | G11C 7/1087 |
| 10,559,550 B2 | 2/2020 | Lee et al. | |
| 10,572,406 B2* | 2/2020 | Oh | G06F 13/1689 |
| 11,194,726 B2 | 12/2021 | Gans | |
| 11,250,894 B2 | 2/2022 | Kwon et al. | |
| 11,295,808 B2 | 4/2022 | Moon et al. | |
| 11,416,437 B2 | 8/2022 | Kinsley et al. | |
| 11,727,982 B2* | 8/2023 | Shaeffer | G11C 11/4091 365/230.03 |
| 2004/0236894 A1* | 11/2004 | Grundy | G06F 13/1684 711/1 |
| 2009/0235113 A1 | 9/2009 | Shaeffer et al. | |
| 2012/0039139 A1 | 2/2012 | Shaeffer | |
| 2013/0036273 A1 | 2/2013 | Shaeffer | |
| 2014/0317470 A1* | 10/2014 | Chung | G06F 11/1048 714/764 |
| 2017/0277633 A1* | 9/2017 | Wilkerson | G06F 12/1009 |
| 2017/0285992 A1* | 10/2017 | Vogt | G11C 7/10 |
| 2019/0294567 A1 | 9/2019 | Khan et al. | |
| 2020/0257331 A1 | 8/2020 | Asaki et al. | |
| 2021/0064463 A1 | 3/2021 | Suh et al. | |
| 2022/0011934 A1 | 1/2022 | Tatapudi et al. | |
| 2023/0170037 A1 | 6/2023 | Suh | |

OTHER PUBLICATIONS

International Search Report and Written Opinion for International Patent Application No. PCT/US2022/079564, mailed Mar. 1, 2023, 20 pages.

JEDEC: "JEDEC Updates Standard for Low Power Memory Devices: LPDDR5", Global Standards for the Microelectronics Industry, Feb. 19, 2019, 3 Pages.

Micron: "LPDDR5 SDRAM Features", May 31, 2021, pp. 1-25, XP93024720, figure 2.

Murdock Brett: "Advantages of LPDDR5: A New Clocking Scheme", Semiconductor Engineering, Sep. 5, 2019, XP055870392, pp. 1-18.

Synopsys: "Key Features Designers Should Know About LPDDR5", LPDDR5 Key Features, DesignWare IP, Retrieved on Sep. 7, 2023, pp. 1-3.

UTMEL: "An Overview of LPDDR", UTMEL Electronic, Oct. 30, 2020, Retrieved on Sep. 7, 2023, pp. 1-7.

* cited by examiner

HYBRID MEMORY SYSTEM WITH INCREASED BANDWIDTH

PRIORITY APPLICATIONS

The present application is a continuation of and claims priority to U.S. patent application Ser. No. 17/658,846, filed Apr. 12, 2022 and entitled "HYBRID MEMORY SYSTEM WITH INCREASED BANDWIDTH," the contents of which is incorporated herein by reference in its entirety.

U.S. patent application Ser. No. 17/658,846 claims priority to U.S. Provisional Patent Application Ser. No. 63/284,439, filed on Nov. 30, 2021 and entitled "HYBRID MEMORY SYSTEM WITH INCREASED BANDWIDTH," the contents of which is incorporated herein by reference in its entirety.

BACKGROUND

I. Field of the Disclosure

The technology of the disclosure relates generally to memory systems and, more particularly, to memory systems that operate in the Joint Electron Device Engineering Council (JEDEC) low-power double data rate (LPDDR) specification space.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. Applications and data for these myriad functions are generally stored in memory within the mobile communication device. With the advent of the myriad functions available to such devices, there has been increased pressure to find ways to reduce power consumption. Memory elements within the mobile communication device are subject to the pressure to reduce power consumption, but also face the requirement to have appropriately low latency through sufficient bandwidth along with being competitively priced. Finding a good balance between these competing factors, and particularly bandwidth demands, provides opportunities for innovation.

SUMMARY

Aspects disclosed in the detailed description include a hybrid memory system with improved bandwidth. In particular, a memory system is provided that increases bandwidth relative to the JEDEC low-power double data rate version 5 (LPDDR5) standard. This improvement is made possible by increasing a data conductor count from sixteen to twenty-four. Optionally, bandwidth may be further improved by increasing a clock frequency from a first value to a second value. This allows the hybrid memory system to provide improved bandwidth without the complications of merely doubling pin counts or doubling clock speed. Further, coding techniques tailored to the pin count and pin layout are provided.

In this regard in one aspect, an integrated circuit (IC) is disclosed. The IC includes a memory bus interface including thirty-two pins. Twenty-four pins correspond to data conductors, four pins correspond to clock conductors, and four pins correspond to read strobe clock (RDQS) conductors. The IC also includes routing and encoding logic associated with the memory bus interface and configured to route signals to pins within the memory bus interface.

In another aspect, a computing device is disclosed. The computing device includes a host. The host includes a physical layer (PHY) including thirty-two pins. Twenty-four pins correspond to data conductors, four pins correspond to clock conductors, and four pins correspond to RDQS conductors. The host also includes routing and encoding logic associated with the PHY and configured to route signals to pins within a memory bus interface. The computing device also includes a memory bus. The memory bus includes twenty-four data conductors, two differential clock channels, and two differential RDQS channels. The computing device also includes a memory module. The memory module includes an input-output (IO) block including the thirty-two pins corresponding to the conductors of the memory bus.

In another aspect, an IC is disclosed. The IC includes a memory bus interface. The memory bus interface includes a plurality of data pins corresponding to data conductors. The memory bus interface also includes a plurality of clock pins corresponding to clock conductors. The IC also includes routing and encoding logic associated with the memory bus interface and configured to encode a byte onto a plurality of data conductors associated with the plurality of data pins.

DETAILED DESCRIPTION

Figure 1A:
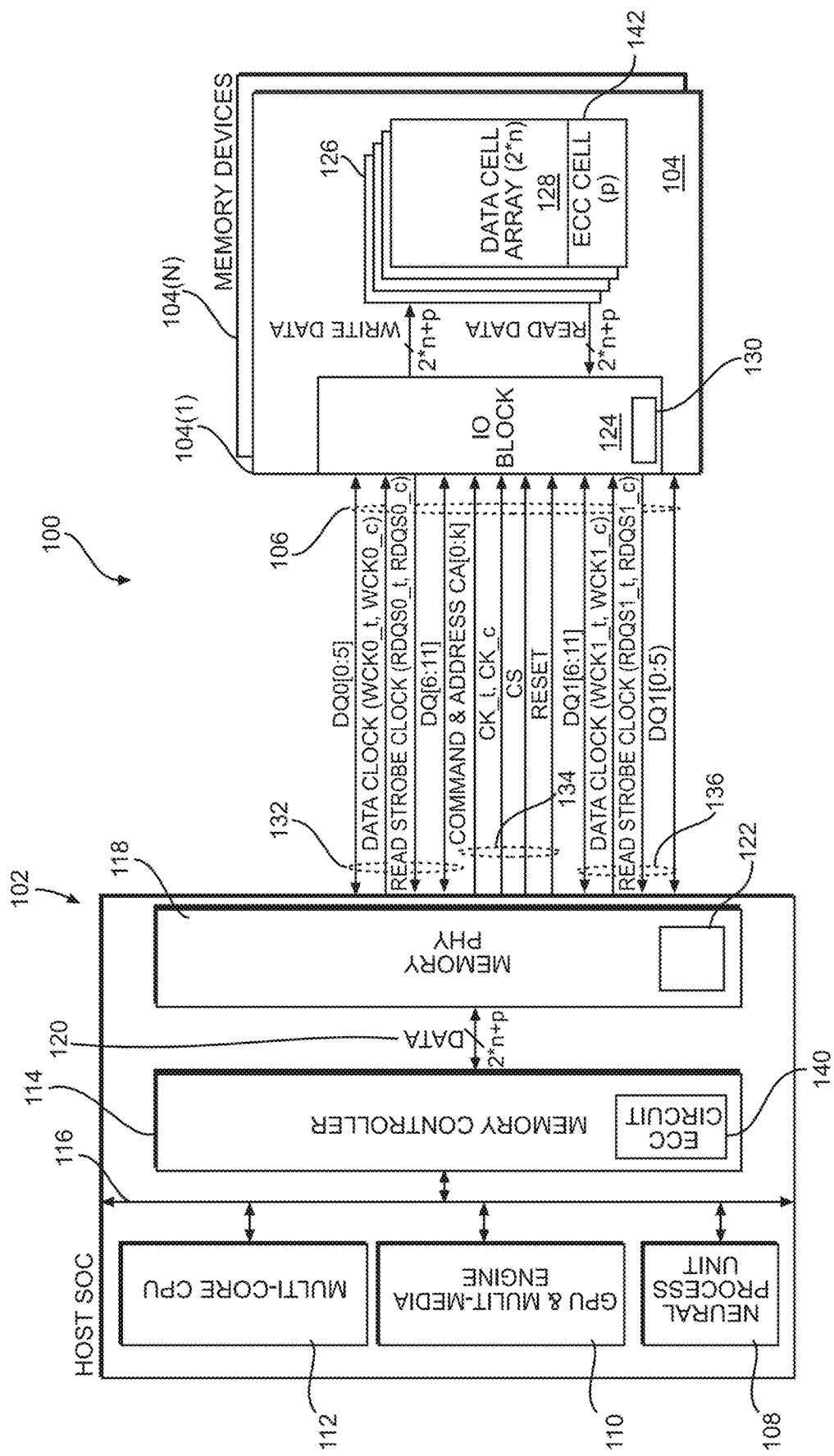
FIG. 1A is a block diagram of an exemplary memory system using a memory bus according to exemplary aspects of the present disclosure.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a hybrid memory system with improved bandwidth. In particular, a memory system is provided that increases bandwidth relative to the JEDEC low-power double data rate version 5 (LPDDR5) standard. This improvement is made possible by increasing a data conductor count from sixteen to twenty-four. Optionally, bandwidth may be further improved by increasing a clock frequency from a first value to a second value. This allows the hybrid memory system to provide improved bandwidth without the complications of merely doubling pin counts or doubling clock speed. That is, while some burden of finding space for additional pins and routing is imposed, this burden is less than would be imposed by merely doubling the number of pins. Likewise, while some electromagnetic compatibility (EMC) type burden and power burden may occur by increasing the clock frequency, this burden is less than would be present from merely doubling the clock frequency. Further, coding techniques tailored to the pin count and pin layout are provided.

As an initial bit of nomenclature, it should be appreciated that double data rate (DDR) is a term of art within the JEDEC specifications and the memory world in general. As used herein, DDR is defined to be a signaling technique that uses both the falling and rising edges of the clock signal. This use of both edges is independent of frequency, and changes (e.g., doubling) in frequency do not fall within DDR unless both edges are used. DDR, as defined herein, is specifically contrasted with single data rate (SDR), which as defined herein, means to transfer data on a rising edge or a falling edge, but not both.

Before addressing exemplary aspects of the present disclosure, a brief overview of a conventional memory system is provided along with an exploration of some challenges facing conventional memory systems. One popular memory system is one that complies with JEDEC's LPDDR5 standard. A typical one channel LPDDR5 system interface consists of sixteen data conductors (DQs), two data mask inversion (DMI) conductors that include data mask and data bus inversion information, two differential clock channels (i.e., four conductors), two differential read strobe clock (RDQS) channels (i.e., four conductors), a command and address (CA) channel, a command clock channel, a chip select channel, and a reset channel. To provide higher bandwidths in such traditional memory systems, four or eight memory devices were typically linked together. The move to newer memory standards is likely imminent and likely to offer a balance of high performance (e.g., typically contemplating twice the bandwidth over LPDDR5), low power, competitive cost, and various package types.

One way that the bandwidth may be doubled is by doubling the clock frequency of the existing standard. However, such a faster clock causes an increase in circuit size and imposes additional technical challenges to provide stable operations. Such an approach would increase the system cost and overhead to provide the increased bandwidth.

A second way that the bandwidth may be doubled is by doubling the number of data conductors of the existing standard. While this approach avoids the power penalty and stability issues associated with the faster clock, this approach consumes substantially more space to accommodate pins for the additional conductors. Likewise, routing conductors within the memory bus becomes increasingly challenging with that many conductors.

Exemplary aspects of the present disclosure strike a compromise by increasing a number of conductors, but not doubling the number of conductors and increasing a clock frequency, but not doubling the clock frequency. While there is some additional burden imposed by the extra conductors, the routing is not insurmountable. Likewise, while some burden is applied by the increased frequency, the increased frequency is not insurmountable.

In this regard, FIG. 1A is a block diagram of a memory system 100 that includes a host 102 and a plurality of memory devices 104(1)-104(N) coupled by one or more memory buses 106 (only one shown). In an exemplary aspect, the host 102 may be an integrated circuit (IC) that performs as a system on a chip (SoC), application processor, main modem, or other control circuit that is designed to access the memory devices 104(1)-104(N). The host 102 may include a neural processing unit 108, a graphics processing unit (GPU) and multimedia engine 110, and/or a multi-core central processing unit (CPU) 112. The neural processing unit 108, the GPU and multimedia engine 110, and/or the multi-core CPU 112 may communicate with a memory controller 114 through a system bus 116. The memory controller 114 may send data to a physical layer (PHY) 118 across a data line 120. The PHY 118 is a memory bus interface and includes a routing and encoding logic 122 (or comparable circuit performing the same functions) that routes the data from the data line 120 to appropriate pins (e.g., data pins) coupled to the memory bus 106.

The memory devices 104(1)-104(N) may be identical, and accordingly, a discussion of a generic memory device 104 is provided. The memory device 104 may include an input-output (I/O) block 124. The I/O block 124 is a memory bus interface and communicates with banks 126 of data cell arrays 128 using read and write commands as is well understood. The I/O block 124 also includes a routing and encoding logic 130 that routes the data from the data line to appropriate pins coupled to the memory bus 106. The memory bus 106 includes twenty-four data conductors, four clock conductors, and four RDQS conductors. Accordingly, the memory bus interfaces 118, 124 may include twenty-four pins (e.g., data pins) corresponding to the data conductors, four pins (e.g., clock pins) corresponding to the clock conductors, and four pins corresponding to the RDQS conductors. Additional conductors may be provided for command and address signals, an additional clock signal, a chip select signal, and/or a reset signal.

In an exemplary aspect, the conductors of the memory bus 106 are arranged in a specific layout that helps minimize crosstalk and generally simplify routing. Namely, from a first edge moving inwards, there are six data conductors (DQ0 [0:5]), a differential clock channel having two conductors (WCK0_t, WCK0_c), a differential RDQS channel having two conductors (RDQS0_t, RDQS0_c) and six data conductors (DQ0[6:11]) shown generally as a first group 132. In a center section of the memory bus 106, a command and address (CA[0:k]) channel conductor, a differential command clock channel having two conductors (CK_t, CK_c), a chip select channel conductor, and a reset channel conductor may be positioned shown generally as a middle group 134. Then, moving outwards toward a second edge of the memory bus, there are six data conductors (DQ1 [6:11]), a differential clock channel having two conductors (WCK1_t, WCK1_c), a differential RDQS channel having two conductors (RDQSI_t, RDQS1_c) and six data conductors (DQ1[0:5]) shown generally as a second group 136. While there are reasons for this arrangement in terms of ease of routing, electromagnetic interference (EMI), and/or electromagnetic compatibility (EMC) (e.g., crosstalk), it should be appreciated that other arrangements may also be used without departing from the scope of the present disclosure.

Further, as an additional feature, the memory controller 114 may include an error correcting code (ECC) circuit 140, which may encode and decode ECC signals. Further, the data cell arrays 128 may include an ECC cell 142 that stores parity bits and works with the ECC circuit 140 for error correction. In an exemplary aspect, ECC parity bits (p, as opposed to data 2*n) may be transmitted over an RDQS pin (e.g., RDQS_t, RDQS_c, or both) from the host 102 to the memory device 104 such as during a write operation. For the reverse direction, the ECC parity bits may be transmitted over data mask slots (e.g., M[0:31] detailed further below) during a read operation. Alternatively, instead of using the RDQS signals, the host 102 may use the data mask slots (e.g., M[0:31]) for a write operation.

The data cell arrays 128 may be arranged into banks in various configurations. Two exemplary bank arrangements are provided in FIGS. 1B and 1C.

Figure 1B:
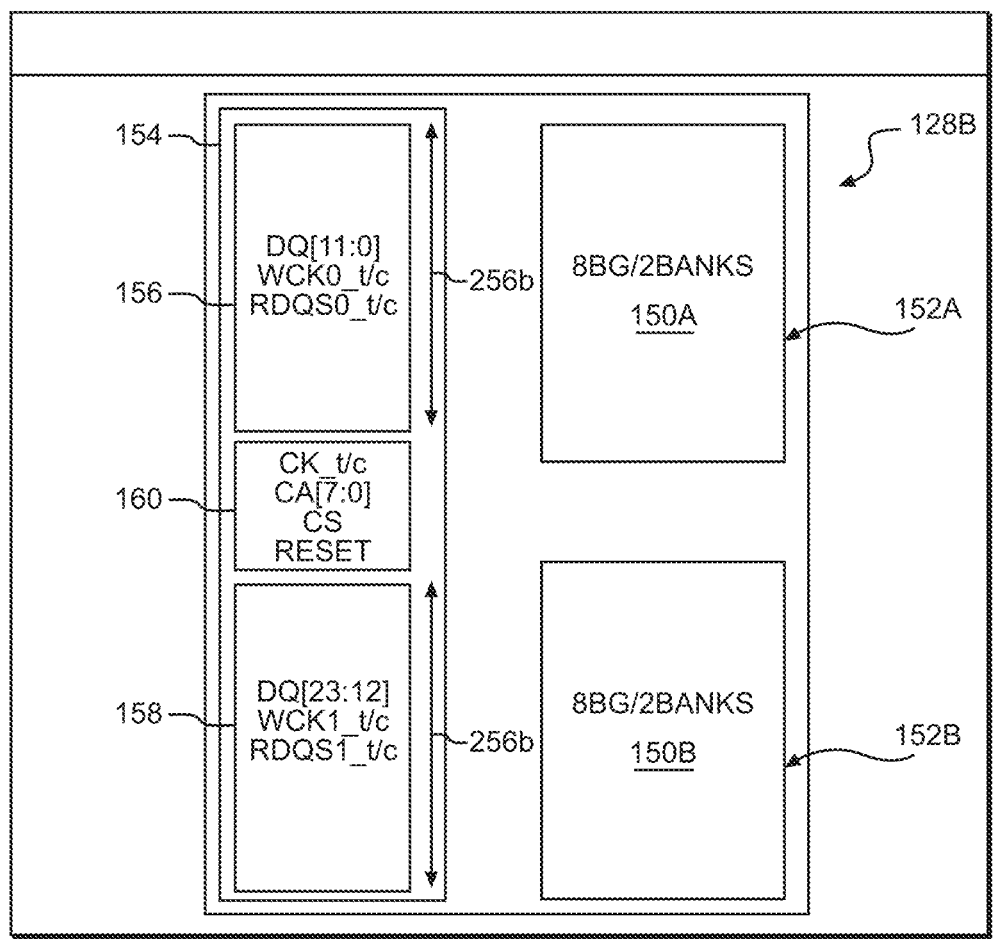
FIG. 1B is a block diagram of an exemplary memory system with a first arrangement of banks within two pseudo-channels.

FIG. 1B illustrates a data cell array 128B, which is related to the existing LPDDR5 standard and has a first memory block 150A having eight bank groups (BG), each with two banks and a second memory block 150B also having eight bank groups (BG), each with two banks, for a total of thirty-two banks. The thirty-two banks are divided into two pseudo-channels 152A, 152B. The data cell array 128B may include an interface 154 that has a first 12 DQ conductors (DQ[11:0]), two conductors that form a first differential write clock (WCK0), and a pair of conductors that form a first redundant data strobe (RDQS0) in a first group 156; and a second twelve DQ conductors (DQ[23:12]), two conductors that form a second differential write clock (WCK1), and two conductors that form a second redundant data strobe (RDQS1) in a second group 158. The groups 156, 158 share a differential clock (CK), seven command and address conductors (CA[7:0]), a chip select conductor (CS), and a reset conductor (all shown in middle group 160). The memory device(s) 104 may have: a maximum bandwidth of 25.6 gigabytes per second (GB/s), an input/output (IO) speed of 6400 megabits per second (Mbps), a maximum CK frequency of 1600 megahertz (MHz), a maximum WCK frequency of 3200 MHZ, a CA speed of 3200 megatransfers per second (MT/s), and operate on a pulse amplitude modulation (PAM) and/or a non-return-to-zero (NRZ) signaling scheme. It should be appreciated that the interface 154 is configured to receive commands and/or data from a remote source such as, for example, the host 102.

Figure 1C:
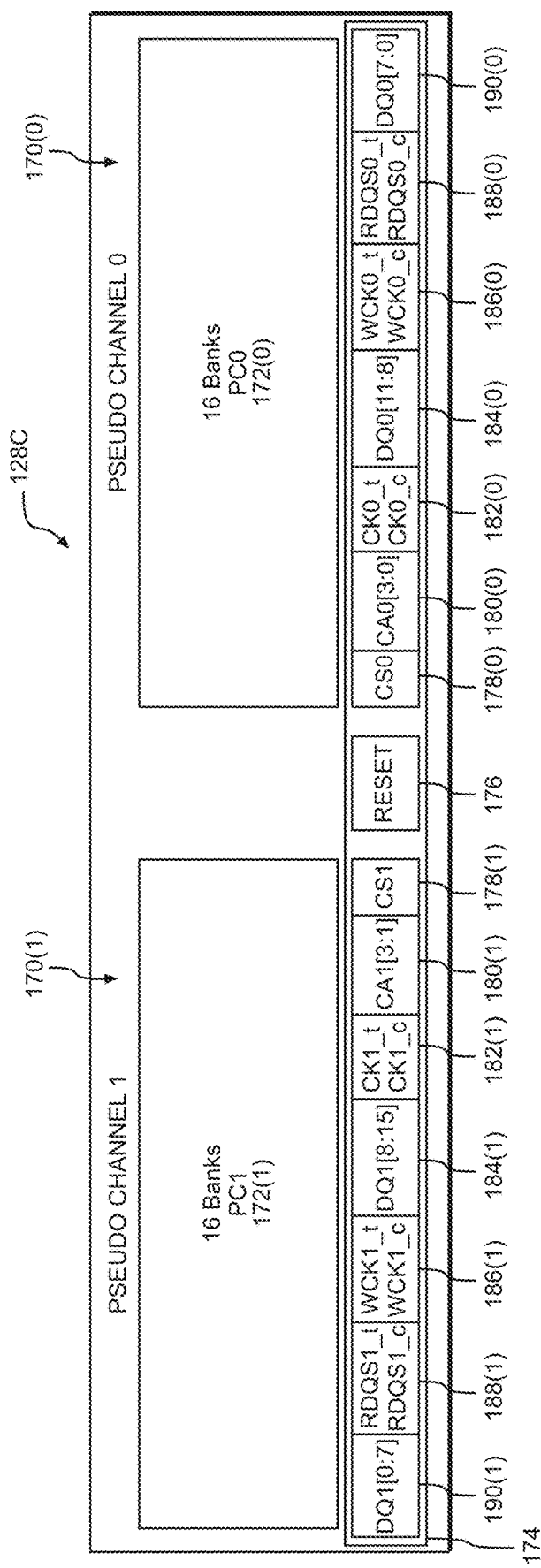
FIG. 1C is a block diagram of an exemplary memory system with a second arrangement of banks within two pseudo-channels.

While the data cell array 128B is one possible implementation of an improved memory configuration, there are other architectures such as data cell array 128C illustrated in Figure 1C. The data cell array 128C includes a first memory block 170(0) having sixteen banks and a second memory block 170(1) having sixteen banks, for a total of thirty-two banks. The thirty-two banks are divided into two pseudo-channels 172(0), 172(1). The pin/conductors of an interface 174 are somewhat different. Specifically, the conductors are mirrored around a central reset conductor 176 that is common to both pseudo-channels 172(0), 172(1). Each pseudo-channel 172(0), 172(1) includes a respective chip select conductor 178(0), 178(1) and four command and address conductors 180(0), 180(1) (CA0[3:0], CA1[3:0]). Additionally, a differential clock conductor 182(0), 182(1) (also referred to as CK0_t/c and CK1_t/c) may be provided to each pseudo-channel 172(0), 172(1). A first set of data channel conductors 184(0), 184(1) (DQ0[15:8], DQ1[8:15]) may be next. Breaking up the data channels are a differential write clock conductor pair 186(0), 186(1) (WCK0_t/c, WCK1_t/c) and a differential RDQS conductor pair 188(0), 188(1) (RDQS0_t/c, RDQS1_t/c). The final data channel conductors 190(0), 190(1) (DQ0[7:0], DQ1[0:7]) provide the external conductors.

In general, the position of the data conductors DQ are spread apart and separated by other conductors to reduce crosstalk and other EMI/EMC concerns. Likewise, by pairing the positive and negative differential signals on conductors adjacent to one another, emissions are likewise reduced.

Figure 2A:
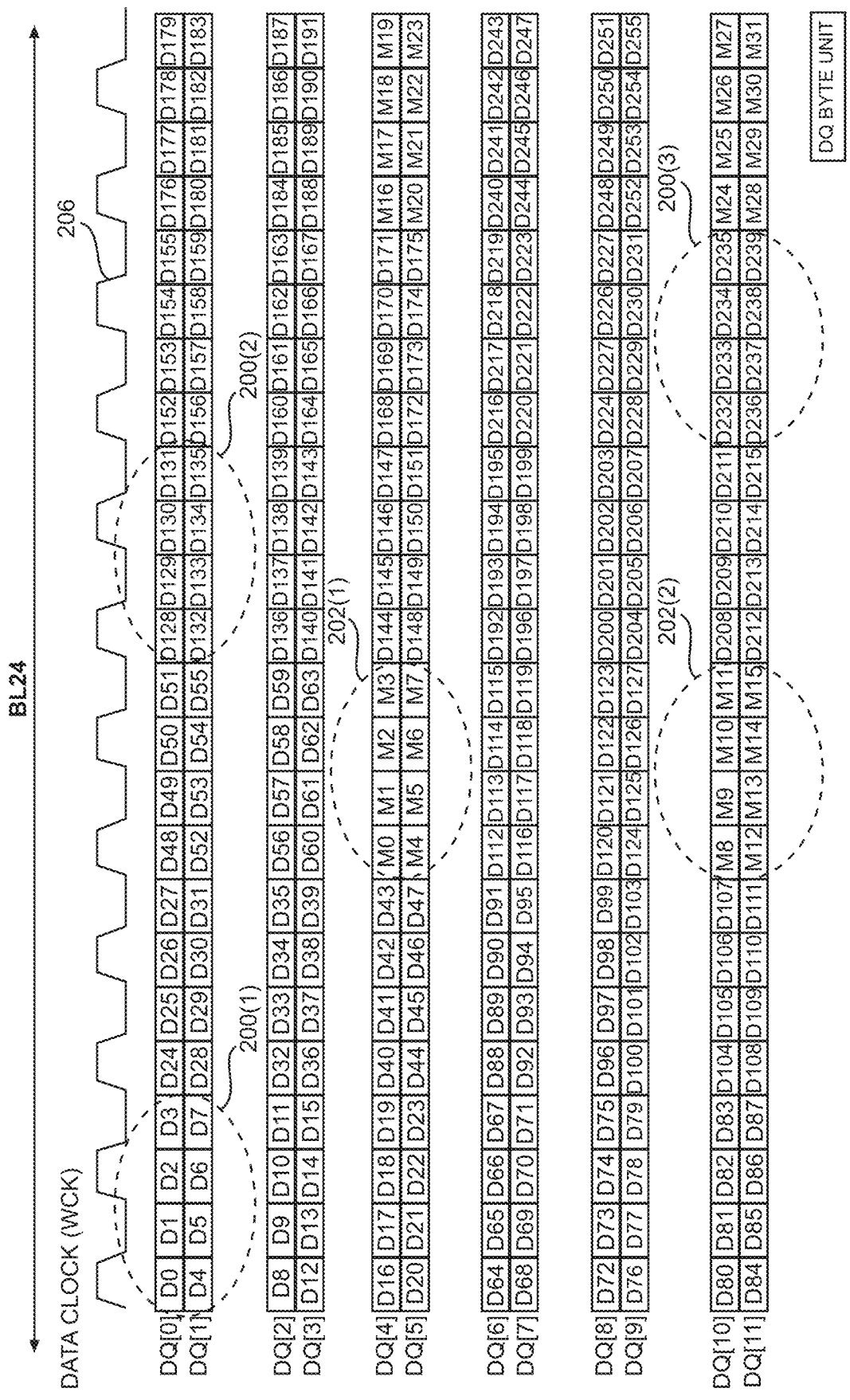
FIG. 2A is a signaling chart illustrating a two data conductor per byte encoding scheme according to an exemplary aspect of the present disclosure.
Figure 2B:
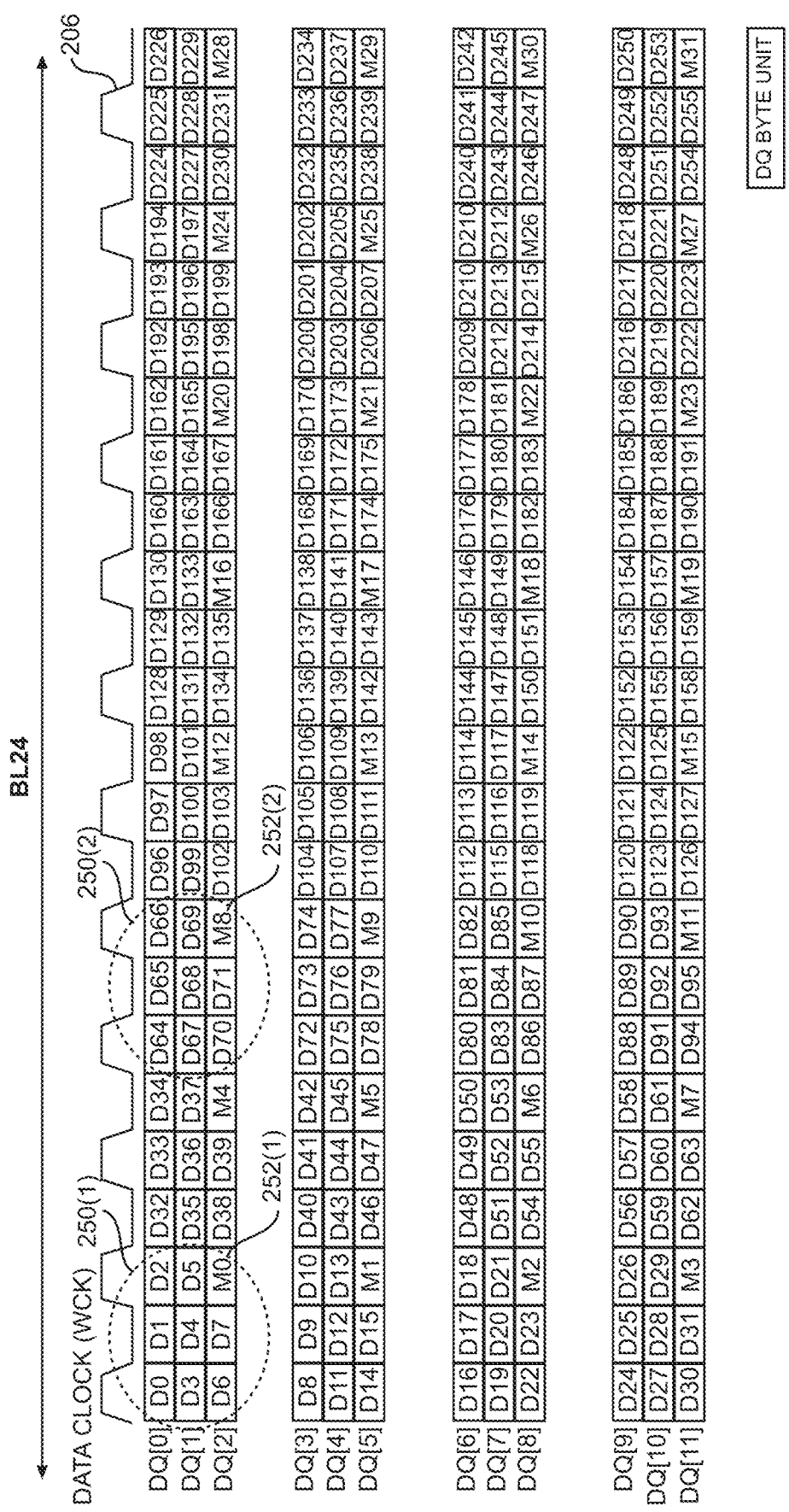
FIG. 2B is a signaling chart illustrating a three data conductor per byte encoding scheme according to an exemplary aspect of the present disclosure.
Figure 2C:
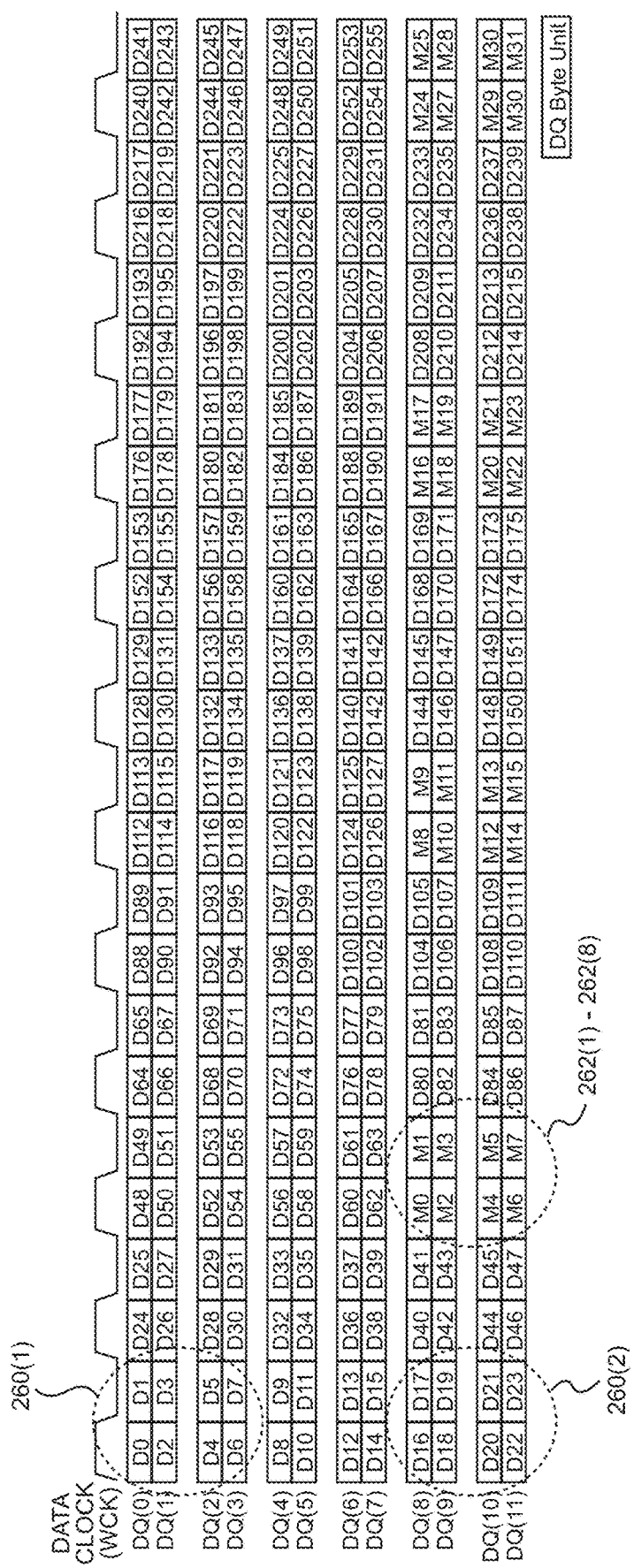
FIG. 2C is a signaling chart illustrating a four data conductor per byte encoding scheme according to an exemplary aspect of the present disclosure.

In practice, the routing and encoding logic 122 or 130 may combine data signals with the data mask signal as better illustrated in FIGS. 2A-2C. FIG. 2A is a signaling chart illustrating two data conductors being used for a single byte (Dx-Dx+7, e.g., D0-D7 or other arrangements such as DQ[48:51] +DQ[64:67]) as generally shown at 200(1)-200(3). Periodically, a data mask signal (Mx-Mx+7, e.g., M0-M7)) is provided as generally shown by 202(1)-202(2). Again, it should be appreciated that other arrangements of data and data masks may be made while still encoding a byte onto two conductors. In an exemplary aspect, a clock signal 206 is 4.8 GHz. In an alternate exemplary aspect, the clock signal 206 is 6.4 GHz.

Alternatively, the routing and encoding logic 122 or 130 may combine data signals and data mask signals so as to encode a byte across three conductors as shown in FIG. 2B. A byte is generally shown at 250(1)-250(2) encoded across three conductors. In this encoding scheme, the data mask bit 252(1)-252(2) is encoded in the ninth slot for each byte. Again, it should be appreciated that other arrangements of data and data masks may be made while still encoding a byte onto three conductors. In an exemplary aspect, the clock signal 206 is 4.8 GHz. In an alternate exemplary aspect, the clock signal 206 is 6.4 GHz.

Alternatively, the routing and encoding logic 122 or 130 may combine data signals and data mask signals so as to encode a byte across four conductors as shown in FIG. 2C. A byte is generally shown at 260(1)-260(2) encoded across four conductors.

In this encoding scheme, the data mask bits 262(1)-262(8) are grouped and encoded in one byte after eight bytes. Again, it should be appreciated that other arrangements of data and data masks may be made while still encoding a byte onto four conductors. In an exemplary aspect, the clock signal 206 is 4.8 GHz. In an alternate exemplary aspect, the clock signal 206 is 6.4 GHz.

It should be appreciated that the frequencies set forth relative to FIGS. 2A-2C may be maximum frequencies. Clock frequency scaling is popularly used in mobile systems, and thus, it may be possible that these maximum frequencies are scaled to lower frequencies.

Figure 3A:
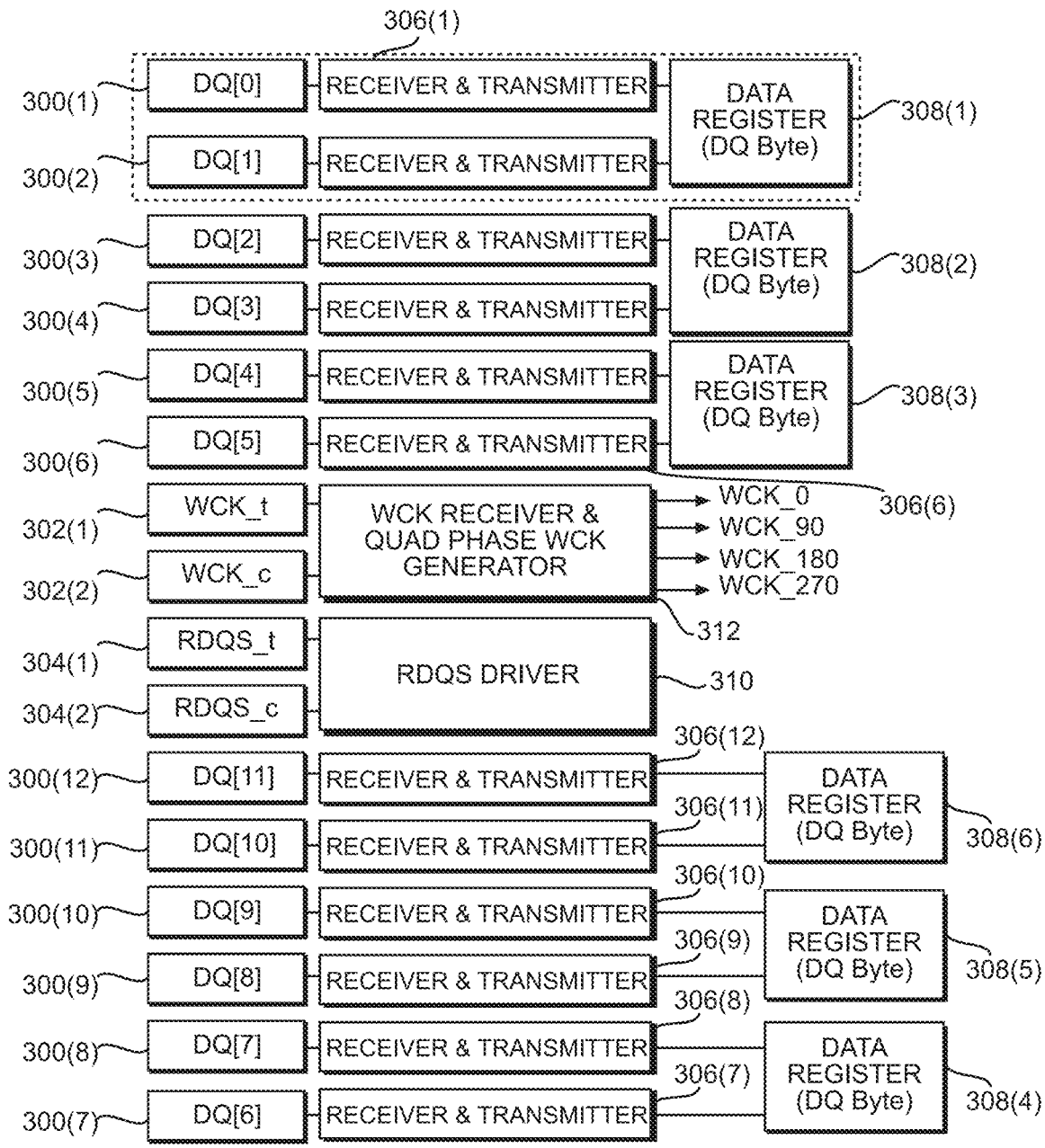
FIG. 3A is an exemplary data receiver structure used with the encoding scheme of FIG. 2A.

FIG. 3A is an exemplary data receiver structure within the memory bus interface 118 or 124 used with the encoding scheme of FIG. 2A. Specifically, pins 300(1)-300(6) may be used to couple to the data conductors DQ[0:5] in the first group 132. Clock pins 302(1)-302(2) may be used to couple to the data clock conductors in the first group 132. RDQS pins 304(1)-304(2) may be used to couple to the RDQS conductors in the first group 132, and pins 300(7)-300(12) may be used to couple to the data conductors DQ[6:11] in the first group 132. The pins 300(1)-300(12) are coupled to respective receiver/transmitter circuitry 306(1)-306(12). The receiver/transmitter circuitry 306(1)-306(12) may be coupled in pairs to data registers 308(1)-308(6). The RDQS pins 304(1)-304(2) may be coupled to an RDQS driver 310. Likewise, the clock pins 302(1)-302(2) may be coupled to a clock receiver and quad phase generator 312.

Figure 3B:
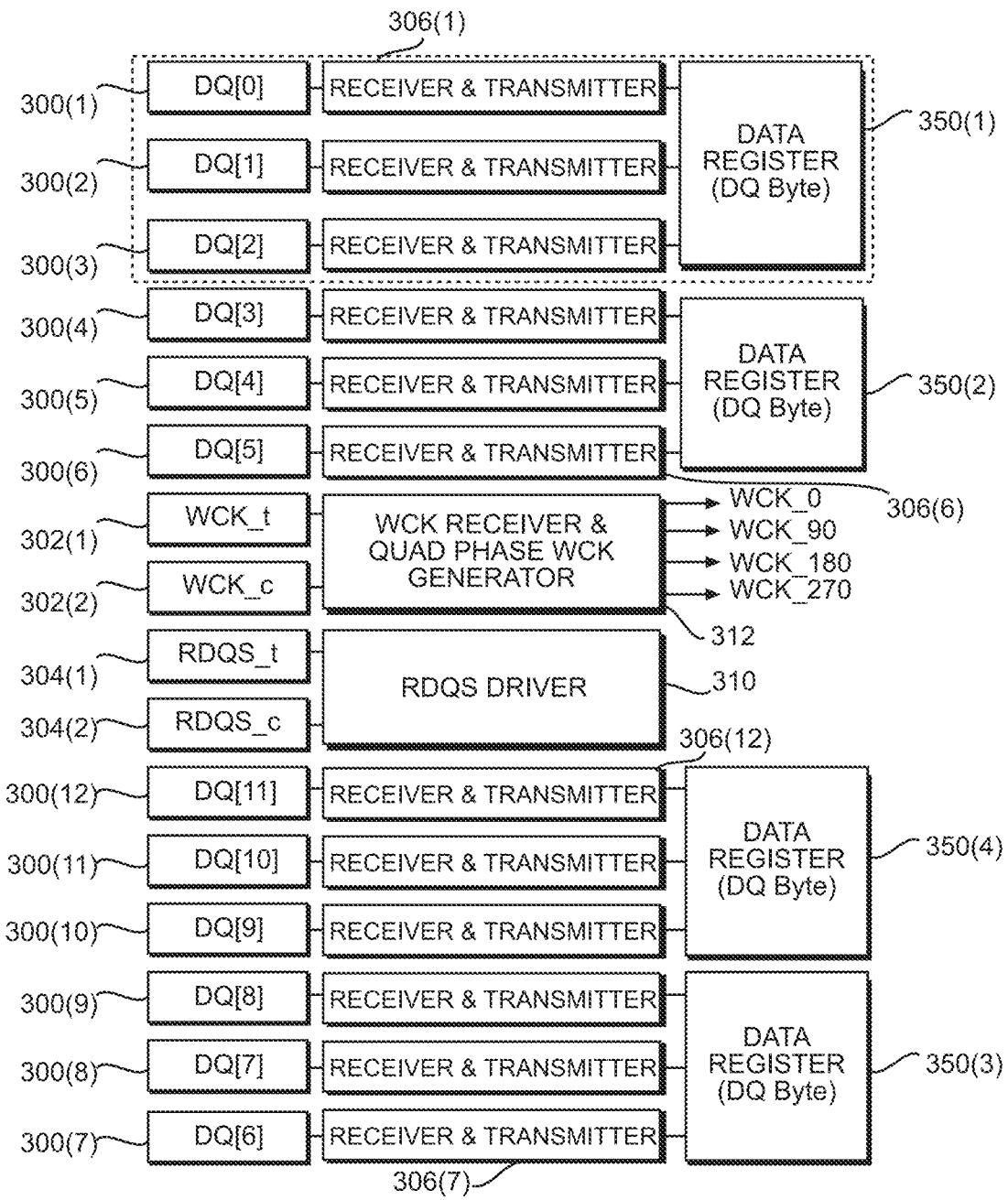
FIG. 3B is an exemplary data receiver structure used with the encoding scheme of FIG. 2B.

FIG. 3B is an exemplary data receiver structure within the memory bus interface 118 or 124 used with the encoding scheme of FIG. 2B. Specifically, the pins 300(1)-300(6) may be used to couple to the data conductors DQ[0:5] in the first group 132. The clock pins 302(1)-302(2) may be used to couple to the data clock conductors in the first group 132. The RDQS pins 304(1)-304(2) may be used to couple to the RDQS conductors in the first group 132, and the pins 300(7)-300(12) may be used to couple to the data conductors DQ[6:11] in the first group 132. The pins 300(1)-300(12) are coupled to respective receiver/transmitter circuitry 306(1)-306(12). The receiver/transmitter circuitry 306(1)-306(12) may be coupled in sets of three to data registers 350(1)-350(4). The RDQS pins 304(1)-304(2) may be coupled to the RDQS driver 310. Likewise, the clock pins 302(1)-302(2) may be coupled to the clock receiver and quad phase generator 312.

Figure 4:
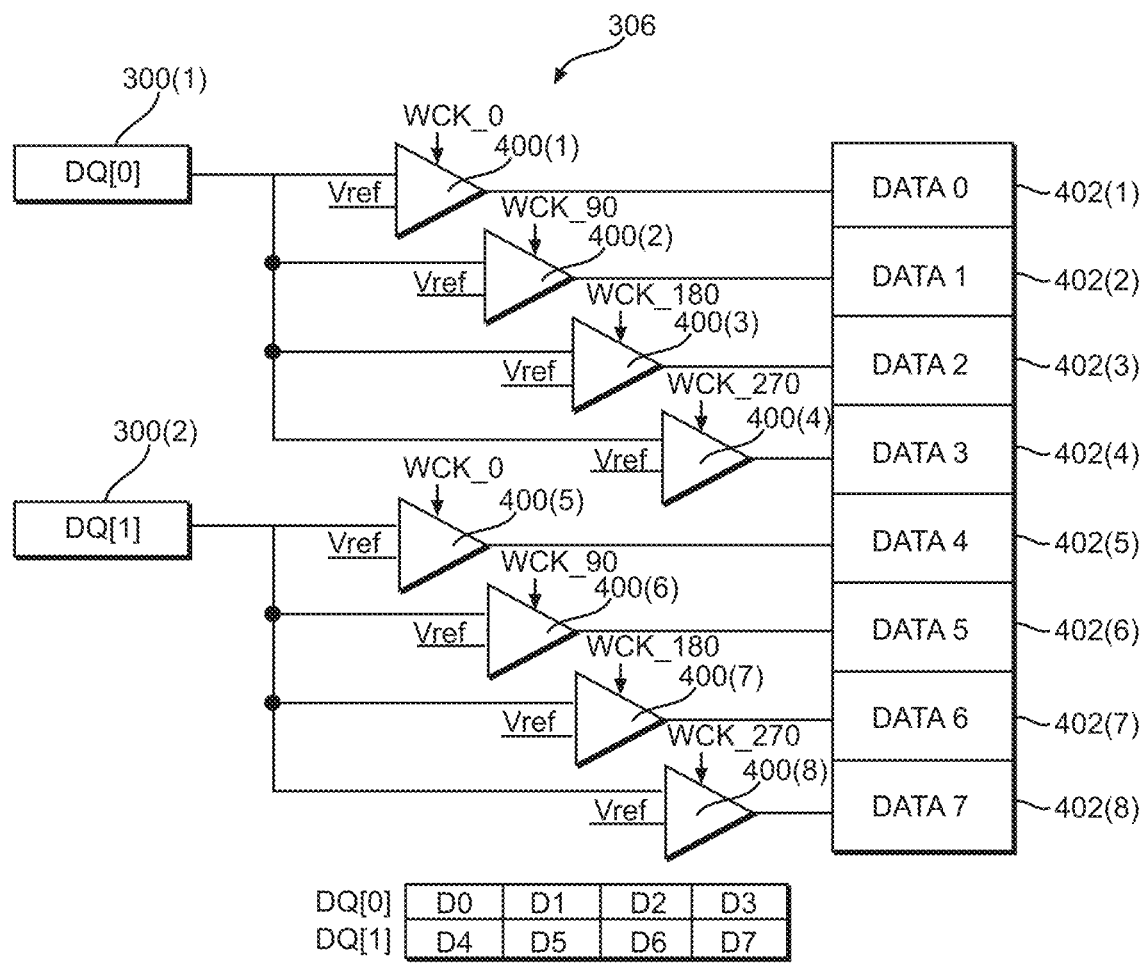
FIG. 4 is a block diagram showing details of the receiver structure of FIG. 3A.

FIG. 4 is a block diagram showing details of how a receiver 306 may accommodate quad phased data. Specifically, a pin 300(1) may be coupled to four delay and comparators 400(1)-400(4) to populate bit register slots 402(1)-402(4). Similarly, a pin 300(2) may be coupled to four delay and comparators 400(5)-400(8) to populate bit register slots 402(5)-402(8). When the signal at a comparator 400(1)-400(8) exceeds a threshold, a logical high (or low) may be output to the bit register slots 402(1)-402(8). In this fashion, more data may be provided for a given clock signal. For example, two clock cycles (2 WCK) may generate four phase data clocks where the first rising edge of WCK is WCK_0, the first falling edge of WCK is WCK_90, the second rising edge of WCK is WCK_180, and the second falling edge of WCK is WCK_270.

The hybrid memory system with improved bandwidth according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 5:
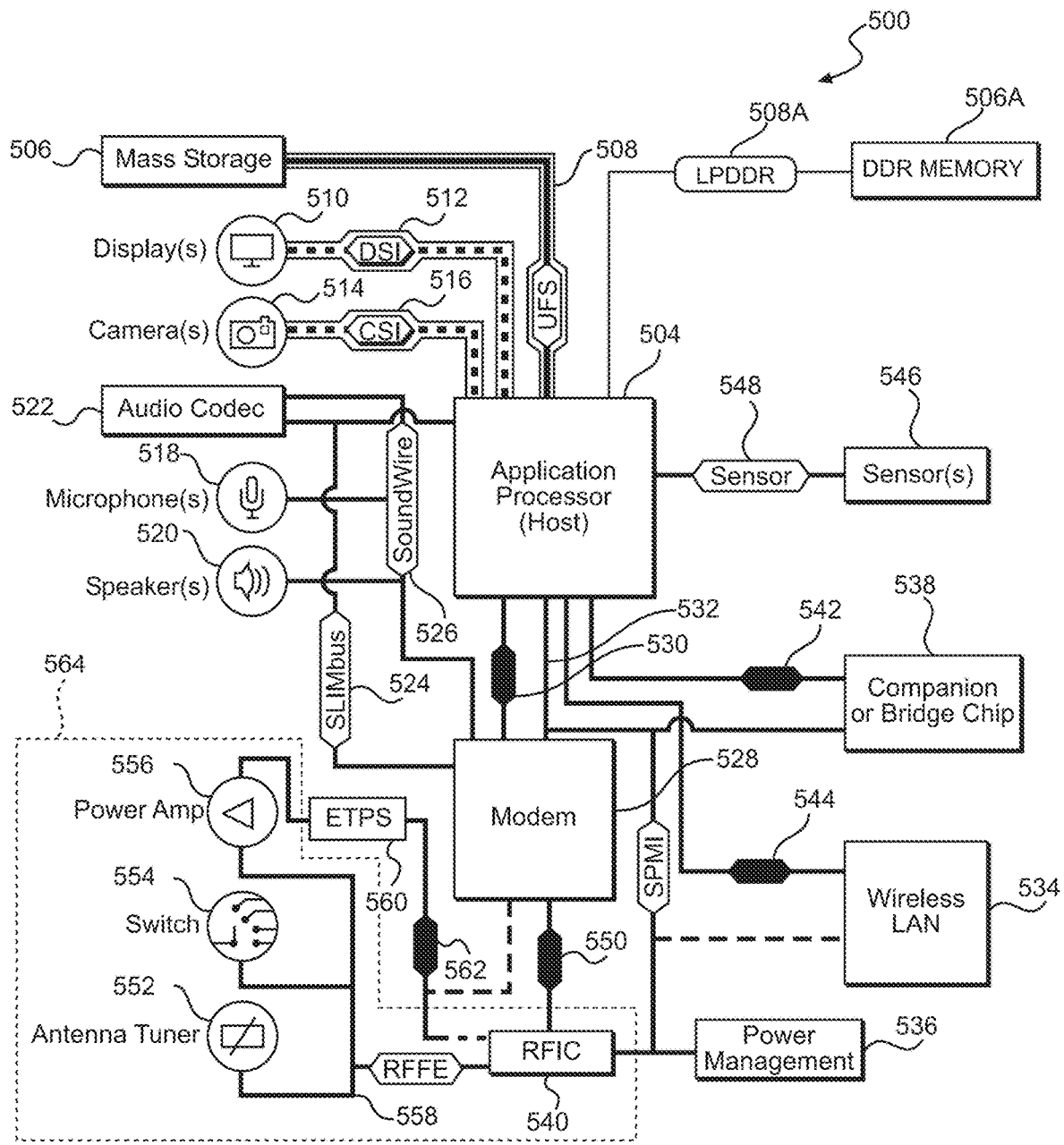
FIG. 5 is a block diagram of an exemplary processor-based system that can include the memory system of FIG. 1.

In this regard, FIG. 5 is a system-level block diagram of an exemplary mobile communication device or mobile terminal 500 such as a smart phone, mobile computing device tablet, or the like. While a mobile terminal is particularly contemplated as being capable of benefiting from exemplary aspects of the present disclosure, it should be appreciated that the present disclosure is not so limited and may be useful in any system having a memory bus that will be compliant with existing or emerging memory standards.

With continued reference to FIG. 5, the mobile terminal 500 includes an application processor 504 (sometimes referred to as a host or an SoC) that communicates with a mass storage element 506 through a universal flash storage (UFS) bus 508. The application processor 504 may also communicate with a DDR memory element 506A through a memory bus 508A according to exemplary aspects of the present disclosure. The application processor 504 may further be connected to a display 510 through a display serial interface (DSI) bus 512 and a camera 514 through a camera serial interface (CSI) bus 516. Various audio elements such as a microphone 518, a speaker 520, and an audio codec 522 may be coupled to the application processor 504 through a serial low-power interchip multimedia bus (SLIMbus) 524. Additionally, the audio elements may communicate with each other through a SOUNDWIRE bus 526. A modem 528 may also be coupled to the SLIMbus 524 and/or the SOUNDWIRE bus 526. The modem 528 may further be connected to the application processor 504 through a peripheral component interconnect (PCI) or PCI express (PCIe) bus 530 and/or a system power management interface (SPMI) bus 532.

With continued reference to FIG. 5, the SPMI bus 532 may also be coupled to a local area network (LAN or WLAN) IC (LAN IC or WLAN IC) 534, a power management integrated circuit (PMIC) 536, a companion IC (sometimes referred to as a bridge chip) 538, and a radio frequency IC (RFIC) 540. It should be appreciated that separate PCI buses 542 and 544 may also couple the application processor 504 to the companion IC 538 and the WLAN IC 534. The application processor 504 may further be connected to sensors 546 through a sensor bus 548. The modem 528 and the RFIC 540 may communicate using a bus 550.

With continued reference to FIG. 5, the RFIC 540 may couple to one or more RFFE elements, such as an antenna tuner 552, a switch 554, and a power amplifier 556 through a radio frequency front end (RFFE) bus 558. Additionally, the RFIC 540 may couple to an envelope tracking power supply (ETPS) 560 through a bus 562, and the ETPS 560 may communicate with the power amplifier 556. Collectively, the RFFE elements, including the RFIC 540, may be considered an RFFE system 564. It should be appreciated that the RFFE bus 558 may be formed from a clock line and a data line (not illustrated).

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. An integrated circuit (IC) comprising:
    a memory bus interface comprising thirty-two pins, wherein:
        twenty-four pins correspond to data conductors;
        four pins correspond to clock conductors; and
        four pins correspond to read strobe clock (RDQS) conductors; and
    routing and encoding logic associated with the memory bus interface and configured to route signals to pins within the memory bus interface.
2. The IC of clause 1, wherein the IC comprises a memory device.
3. The IC of clause 2, wherein the memory bus interface comprises an input-output (IO) block.
4. The IC of clauses 1 to 3, wherein the IC comprises a system on a chip (SoC).
5. The IC of clause 4, wherein the memory bus interface comprises a physical layer (PHY).
6. The IC of clauses 1 to 3, wherein the IC comprises a host.
7. The IC of clauses 1 to 6, wherein the thirty-two pins comprise a first group and a second group, wherein the first group comprises:
    a first six pins of the twenty-four pins corresponding to the data conductors;
    a first two pins of the four pins corresponding to the clock conductors positioned adjacent to the first six pins;
    a second two pins of the four pins corresponding to the RDQS conductors adjacent to the first two pins; and
    a second six pins of the twenty-four pins corresponding to the data conductors adjacent to the second two pins.
8. The IC of clause 7, wherein the first two pins are configured to form a differential clock channel.
9. The IC of clause 7, wherein the second two pins are configured to form a differential RDQS channel.
10. The IC of clause 7, wherein the second group comprises:
    a third six pins of the twenty-four pins corresponding to the data conductors;
    a third two pins of the four pins corresponding to the clock conductors positioned adjacent to the third six pins;
    a fourth two pins of the four pins corresponding to the RDQS conductors adjacent to the third two pins; and
    a fourth six pins of the twenty-four pins corresponding to the data conductors adjacent to the fourth two pins.
11. The IC of clause 10, wherein the third two pins are configured to form a differential clock channel.
12. The IC of clause 10, wherein the fourth two pins are configured to form a differential RDQS channel.
13. The IC of clause 10, further comprising a third group of additional pins between the first six pins of the twenty-four pins and the third six pins of the twenty-four pins.
14. The IC of clause 13, wherein the third group of additional pins comprises:
    a first command clock pair of pins;
    a second command clock pair of pins;
    a first set of four command and address pins;
    a second set of four command and address pins;
    a first chip select pin;
    a second chip select pin; and
    a reset pin.
15. The IC of clause 14, wherein the reset pin is centrally located amongst all pins of the memory bus interface.
16. The IC of clause 15, wherein the first command clock pair of pins is adjacent to the second six pins of the twenty-four pins.
17. The IC of clause 16, wherein the second command clock pair of pins is adjacent to the third six pins of the twenty-four pins.
18. The IC of clauses 16 or 17, wherein the first set of four command and address pins is adjacent to the first command clock pair of pins.
19. The IC of clause 17, wherein the second set of four command and address pins is adjacent to the second command clock pair of pins.
20. The IC of clauses 1 to 19, further comprising a clock source, wherein the clock source is configured to generate a clock signal having a maximum frequency of 4.8 gigahertz (GHz).

21. The IC of clauses 1 to 20, further comprising a clock source, wherein the clock source is configured to generate a clock signal having a maximum frequency of 6.4 gigahertz (GHz).
22. The IC of clauses 1 to 21, wherein the routing and encoding logic is configured to encode a byte onto two data conductors.
23. The IC of clauses 1 to 21, wherein the routing and encoding logic is configured to encode a byte onto three data conductors.
24. The IC of clauses 1 to 21, wherein the memory bus interface further comprises a command and address (CA) pin, a command clock pin, a chip select pin, and a reset pin.
25. The IC of clauses 1 to 24, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.
26. The IC of clauses 1 to 25, wherein the routing and encoding logic is further configured to send a first error correcting code (ECC) parity bit through two of the four pins corresponding to an RDQS conductor and receive a second ECC parity bit through eight of the twenty-four pins corresponding to a data conductor.
27. The IC of clauses 1 to 25, wherein the routing and encoding logic is further configured to send a first error correcting code (ECC) parity bit through eight of the twenty-four pins corresponding to a data conductor and receive a second ECC parity bit through the eight of the twenty-four pins corresponding to the data conductor.
28. The IC of clauses 1 to 25, wherein the routing and encoding logic is further configured to send a first error correcting code (ECC) parity bit through one of the four pins corresponding to an RDQS conductor and receive a second ECC parity bit through one of the twenty-four pins corresponding to a data conductor.
29. The IC of clauses 1 to 25, wherein the routing and encoding logic is further configured to send a first error correcting code (ECC) parity bit through one of the twenty-four pins corresponding to a data conductor and receive a second ECC parity bit through the one of the twenty-four pins corresponding to the data conductor.
30. The IC of clauses 1 to 21, wherein the routing and encoding logic is configured to encode a byte onto four data conductors.
31. A computing device comprising:
    a host comprising:
        a physical layer (PHY) comprising thirty-two pins, wherein:
            twenty-four pins correspond to data conductors;
            four pins correspond to clock conductors; and
            four pins correspond to read strobe clock (RDQS) conductors; and
        routing and encoding logic associated with the PHY and configured to route signals to pins within a memory bus interface;
    a memory bus comprising:
        twenty-four data conductors;
        two differential clock channels; and
        two differential RDQS channels; and
    a memory module comprising:
        an input-output (IO) block comprising the thirty-two pins corresponding to the conductors of the memory bus.
32. An integrated circuit (IC) comprising:
    a memory bus interface comprising:
        a plurality of data pins corresponding to data conductors; and
        a plurality of clock pins corresponding to clock conductors; and
    routing and encoding logic associated with the memory bus interface and configured to encode a byte onto a plurality of data conductors associated with the plurality of data pins.
33. The IC of clause 32, wherein the routing and encoding logic is configured to encode the byte onto two data conductors of the plurality of data conductors.
34. The IC of clause 32, wherein the routing and encoding logic is configured to encode the byte onto three data conductors of the plurality of data conductors.
35. The IC of clause 32, wherein the routing and encoding logic is configured to encode the byte onto four data conductors of the plurality of data conductors.
36. The IC of any of clauses 32 to 35, wherein the routing and encoding logic is configured to encode data mask inversion (DMI) information onto at least one data conductor of the plurality of data conductors.
37. The IC of any of clauses 32 to 36, wherein the routing and encoding logic is further configured to send a first error correcting code (ECC) parity bit through one data conductor of the plurality of data conductors and receive a second ECC parity bit.

What is claimed is:
1. A memory device having a plurality of memory banks, comprising:
    a first pseudo-channel coupled to a first group of the plurality of memory banks, comprising:
        a first group of data conductors configured to receive or send data in the first pseudo-channel, wherein data signals and data mask signals are combined to encode a byte across a plurality of data conductors of the first group of data conductors;
        a first differential write clock conductor pair configured to receive first clock signals for reading or writing the data in the first pseudo-channel; and
        a first differential read strobe clock (RDQS) conductor pair configured to send first strobe signals during a read operation for the data in the first pseudo-channel; and
    a second pseudo-channel coupled to a second group of the plurality of memory banks, comprising:
        a second group of data conductors configured to receive or send data in the second pseudo-channel;
        a second differential write clock conductor pair configured to receive second clock signals for reading or writing the data in the second pseudo-channel; and
        a second differential RDQS conductor pair configured to send second strobe signals during a read operation for the data in the second pseudo-channel.

2. The memory device of claim 1, wherein the first group of data conductors consists of 12 pins and the second group of data conductors consists of 12 pins.

3. The memory device of claim 1, where the plurality of data conductors of the first group of data conductors is two, three, or four data conductors.

4. The memory device of claim 1, where the plurality of data conductors of the first group of data conductors couples to a data register.

5. The memory device of claim 1, wherein a clock signal on the first differential write clock conductor pair is 4.8 gigahertz (GHz) or 6.4 GHz.

6. The memory device of claim 1, wherein the data conductors of the first group of data conductors are separated by other conductors and the data conductors of the second group of data conductors are separated by other conductors.

7. The memory device of claim 1, wherein conductors of the first differential write clock conductor pair are adjacent to one another, conductors of the first differential RDQS conductor pair are adjacent to one another, conductors of the second differential write clock conductor pair are adjacent to one another, and conductors of the second differential RDQS conductor pair are adjacent to one another.

8. The memory device of claim 1, where the first differential write clock conductor pair is coupled to a clock receiver and quad phase generator configured to generate four phase data clocks.

9. The memory device of claim 1, further comprising a reset conductor configured to receive a reset signal that is common to both the first pseudo-channel and the second pseudo-channel.

10. The memory device of claim 1, wherein the first pseudo-channel further comprises a first chip select conductor and first command and address conductors and wherein the second pseudo-channel further comprises a second chip select conductor and second command and address conductors.

11. The memory device of claim 1, wherein the first group of the plurality of memory banks consists of 16 banks.

12. The memory device of claim 1, wherein the memory device is coupled to a host system on a chip (SoC).

13. The memory device of claim 1, wherein a data mask signal is provided through the first group of data conductors periodically.

14. The memory device of claim 13, wherein a byte is encoded across three conductors and a data mask bit is encoded in the ninth slot for each byte.

* * * * *